United States Patent [19]

Chu et al.

[11] Patent Number: 5,400,286
[45] Date of Patent: Mar. 21, 1995

[54] SELF-RECOVERING ERASE SCHEME TO ENHANCE FLASH MEMORY ENDURANCE

[75] Inventors: Sam S. D. Chu, San Jose; Calvin V. Ho, Berkeley, both of Calif.

[73] Assignee: Catalyst Semiconductor Corp., Santa Clara, Calif.

[21] Appl. No.: 107,479

[22] Filed: Aug. 17, 1993

[51] Int. Cl.⁶ ............................................. G11C 13/00
[52] U.S. Cl. ..................................... 365/218; 365/900
[58] Field of Search .......................... 365/185, 218, 900

[56] References Cited

PUBLICATIONS

Yamada, "A Self-Convergence Erasing Scheme for Simple Stacked Gate Flash EEPROM," IEDM 1991, pp. 307–308.
Endoh, "New Write/Erase Operation Technology for Flash EEPROM Cells to Improve the Read Disturb Characteristics," IEDM 1992, pp. 603–606.
Oyama, "A Novel Erasing Technology for 3.3V Flash Memory ...," IEDM 1992, pp. 607–610.

Primary Examiner—Terrell W. Fears
Attorney, Agent, or Firm—Skjerven, Morrill, MacPherson, Franklin & Friel

[57] ABSTRACT

Word line stress is used to narrow the distribution of threshold voltages after an erase of an array of memory cells. One embodiment of the invention provides a method for erasing an array including a standard erase technique followed by extra erase pulses to create a margin between threshold voltages of the cells and the erase verify level, then applying word line stress to narrow the distribution of threshold voltages. Another embodiment in addition includes verifying that all of the memory cells are still erased after applying word line stress and if any of the memory cells were over-stressed and are not erased, repeating the method but using less word line stress. The erase methods according to embodiments of the present invention can be implemented by an external CPU which executes an erase program or by circuitry embedded in an EEPROM.

23 Claims, 5 Drawing Sheets

SELF-RECOVERING ERASE SCHEME TO ENHANCE FLASH MEMORY ENDURANCE

BACKGROUND OF THE INVENTION

1. Field of the Invention

This invention relates to Electrically Erasable Programmable Read Only Memory (EEPROM) and in particular to methods and circuits for erasing arrays of stacked gate memory cells.

2. Description of Related Art

Typical flash EEPROMs contain millions of memory cells arranged in rows and columns. FIG. 1 shows part of a prior art EEPROM array including a column of stacked gate memory cells 11–14. Stacked gate memory cells take several forms. For example, a stacked gate memory cell can be a single floating gate transistor or a combination of a select transistor and a floating gate transistor. Examples of how to make stacked gate memory cells are provided in U.S. Pat. No. 5,033,023 entitled "High Density EEPROM Cell and Process for Making the Cell" issued to Hsia, et al. which is incorporated herein by reference in its entirety.

Stacked gate memory cells are programmed, erased, or read by applying voltages to the terminals of the memory cell. For example, to read memory cell 11 in FIG. 1, bit line BL1 which connects to drain 11D may be precharged to about 1 volt while source line SL1 attached to source 11S is kept at 0 volts. (The terms source and drain are used herein to identify current carrying terminals of a memory cell, even though memory cells are not limited to single transistors.) A voltage of 5 volts is then applied to word line WL1 and therefore to control gate 11G, while all other word lines WL2–WL4 are kept at 0 volts. If the threshold voltage of memory cell 11 is low enough, for example less than 3 volts, memory cell 11 turns on and current flows from bit line BL1 through memory cell 11. If the threshold voltage of memory cell 11 is high, for example greater than 6 volts, memory cell 11 remains off. If all other memory cells attached to bit line BL1 (memory cells 12–14) remain off, no current flows in bit line BL1. The state of memory cell 11 is then read by sensing the voltage or current flow on bit line BL1.

Voltages applied to sources, drains, and control gates can also program or erase the memory cells. Programming or erasing changes the threshold voltages of memory cells by changing the amount of charge stored in floating gates. For a typical n-channel stacked gate memory cell, programming (raising the threshold voltage to a high level) is accomplished using hot electron injection from the drain junction, and erasing (lowering the threshold voltage to a low level) is accomplished using Fowler-Nordheim tunneling from the source junction to the floating gate through a thin tunnel oxide.

Flash EEPROM are typically initialized by simultaneously erasing all of the stacked gate memory cells. Information is then stored in the flash EEPROM by programming individual cells. Simultaneous erasure of memory cells, sometimes referred to as a block erase, can also be performed on a part of an EEPROM, for example on a number of rows in an array.

After a block erase, the stacked gate memory cells do not have exactly the same threshold voltage. Instead, there is a distribution of threshold voltages. Such distributions are unavoidable for many reasons. For example, perfect precision during fabrication can not be achieved. Each memory cell always has at least minor differences from the others which causes the threshold voltages of some memory cells to drop faster than the threshold voltages of other cells.

Cycles of programming and erasing the memory cells change memory cells and widen the distribution of threshold voltages. Because hot carriers (either holes or electrons) can be trapped in oxide layers, cells have some hysteresis or memory of past programming. After many erase-program cycles, a block erase creates a distribution of threshold voltages so large that some memory cells are over-erased or erratic-erased.

Over-erased memory cells are memory cells with threshold voltages low enough to interfere with reading or programming of cells in the array. During reading, for example, over-erased memory cells leak sufficient current to affect sensing from the attached bit lines. Referring again to FIG. 1, during reading of memory cell 11, 5 volts is applied to word line WL1 and bit line BL1, and 0 volts is applied to word lines WL2–WL4 and source 11S. If memory cell 12 is over-erased, the memory cell 12 turns on or leaks and causes a current on bit line BL1 regardless of whether memory cell 11 is programmed or erased.

Over-erased memory cells can also produce errors during programming of memory cells. A typical n-channel memory cell is programmed (set to have a threshold voltage of about 6 volts or higher) by holding the source at 0 volts, taking the drain (or attached bit line) to about 6.5 volts, and taking the control gate (or attached word line) above 12 volts for approximately 10 $\mu$s. Leaky memory cells may lower the voltage on the attached bit line and affect programming speed. Also, the threshold voltages of over-erased cells may be too low to raise to the desired level above 6 volts in the 10 $\mu$s programming time.

The lives of flash EEPROMs are limited because program-erase cycles widen the threshold voltage distribution so that when the cells with the highest threshold voltages are erased, the cells with the lowest threshold voltage are over-erased. The over-erased memory cells make flash EEPROMs inoperable. To extend flash EEPROM life, methods and structures are needed to keep the threshold voltage distributions narrow.

SUMMARY OF THE INVENTION

Embodiments of the present invention provide methods and structures for using word line stress (gate voltage stress) to reduce the distribution of threshold voltages after a block erase of memory cells. The method is generally applicable to electrically programmable erasable memory cells which rely on stored charge, such as stacked gate and split gate memory cells, as well as memory cells which rely of trapped charge such as MNOS (Metal Nitride Oxide Silicon) cells. The erase methods, by keeping the distribution of threshold voltages narrow even after many erase-program cycles, recover over-erased memory cells and prolong the useful life the array.

One embodiment of the invention provides a method for erasing an array of memory cells, including the steps of: applying voltages to terminals of the memory cells to erase the cells; verifying whether all of the cells are erased and repeating application of the erase voltages if the verification shows any cells are not erased; further applying erase voltages to create a margin between threshold voltages of the cells and an erase verify voltage level; and applying word line stress to narrow the distribution of threshold voltages of the memory cells. Word line stress is typically applied by applying a voltage to the control gates while grounding source and drain terminals.

Another embodiment utilizes the steps of the above-described method, verifies whether all of the memory cells are still erased after applying word line stress, and if any of the memory cells were over-stressed and fail the erase verify, repeats the above described erase using less word line stress.

Still another embodiment of the present invention uses Fowler-Nordheim tunneling to erase memory cells then uses Fowler-Nordheim tunneling to recover over-erased memory cells. Using similar erase and recovery mechanisms causes the cells that erase the fastest to recover the fastest and therefore provides a narrower distribution of threshold voltages.

Any of the previously described embodiments can further include an initial step of programming all of the memory cells to have a high threshold voltage before the erase begins.

The erase methods according to embodiments of the present invention can be implemented by an external microprocessor or microcontroller connected to an EEPROM chip or by circuitry embedded on an EEPROM chip.

This invention will be more fully understood in view of the following detailed description taken together with the drawings.

DETAILED DESCRIPTION OF THE PREFERRED EMBODIMENTS

Embodiments of the present invention use word line stress to provide a narrower threshold voltage distribution after a block erase of an array of memory cells. The word line stress can be applied to a memory cell by applying the same voltage (ground voltage) to source and drain terminals of the memory cell and applying a different voltage to the control gate.

In the case of an n-channel stacked gate memory cell, a positive voltage on the control gate tends to increase the threshold voltage of the memory cell. The rate of increase in the threshold voltage directly depends on the electric field across the tunnel oxide, and therefore on the control gate voltage, the effective thickness of the oxide, and the threshold voltage of the memory cell. Word line stress is the reverse process from the erase, both are Fowler-Nordheim (F-N) tunneling through the tunnel oxide, therefore the cells that erase faster also recover faster. The rates of word line stress recovery for any specific design of memory cell can be experimentally determined.

FIGS. 2A, 2B, 2C, and 2D show experimental plots of threshold voltage $V_t$ versus time for typical stacked gate memory cells under word line stress. Each memory cell has a channel length of 1.6 $\mu$m and a 108 Å tunnel oxide layer.

Figure 1:
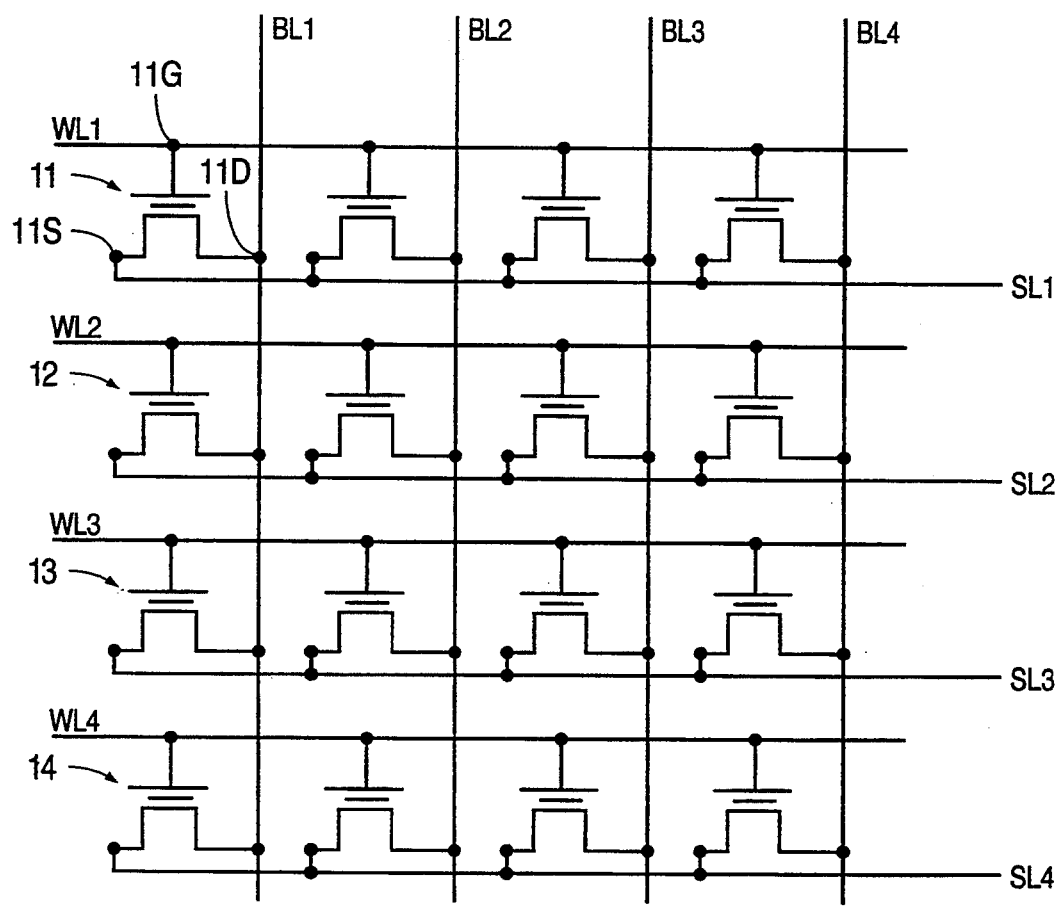
FIG. 1 shows a prior art array of stacked gate memory cells.
Figure 2A:
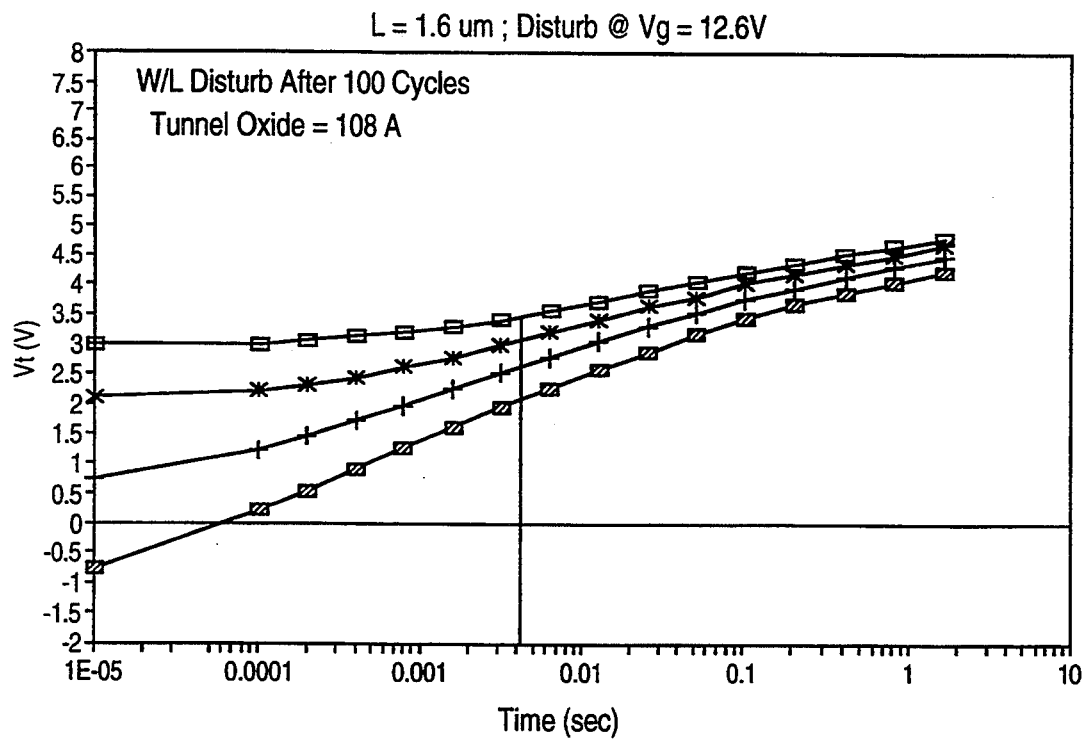
FIGS. 2A, 2B, 2C, and 2D show experimental plots of the threshold voltage verses time for stacked gate memory cells with different applied word line stress and after different numbers of program-erase cycles.

FIG. 2A shows plots for four memory cells each having a control gate voltage $V_g$ which is 12.6 volts higher than the source and drain voltage. All of the plots show threshold voltage $V_t$ rising with time. However, the rise in threshold voltage is fastest for the memory cell with the lowest threshold voltage and slowest for the memory cell with the highest threshold voltage. The different rates of change in threshold voltage causes the threshold voltage distribution to narrow from almost 4 volts (from highest threshold voltage to lowest threshold voltage) to about 2.5 volts in 10 msec.

Figure 2B:
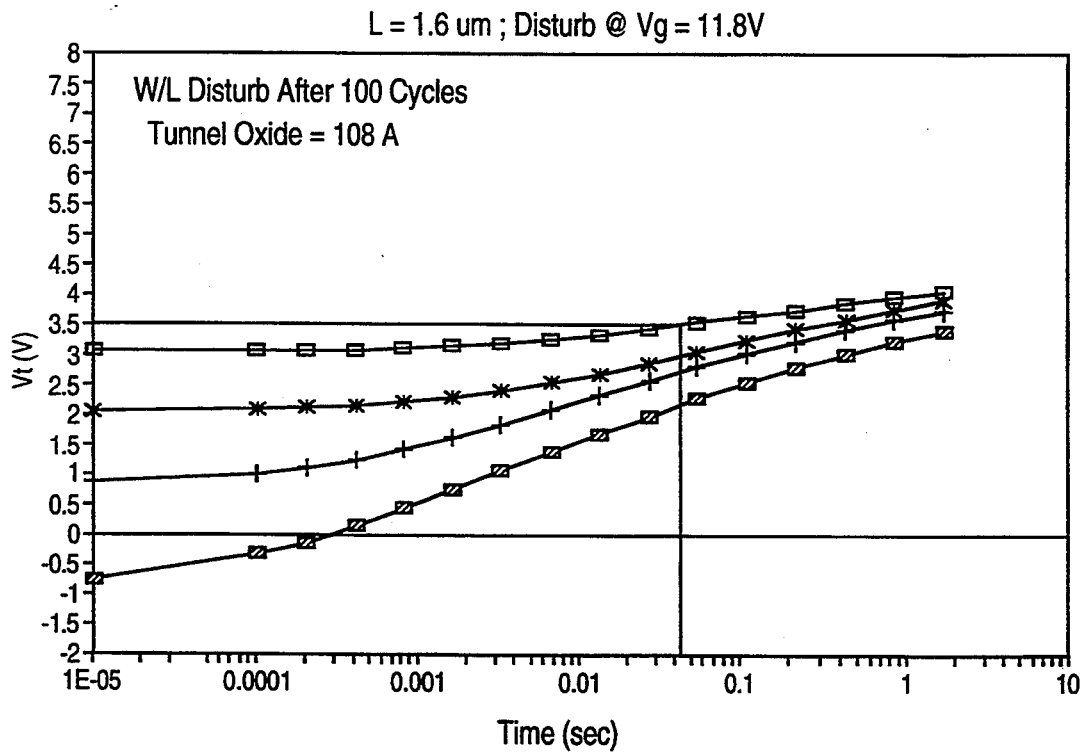

FIG. 2B shows plots for four memory cells each having a control gate voltage $V_g$ which is 11.8 volts higher than the source and drain voltage. As can be seen by comparing FIG. 2B with FIG. 2A, the lower applied control gate voltage causes the threshold voltages to rise more slowly, but still causes the distribution to narrow.

Figure 2C:
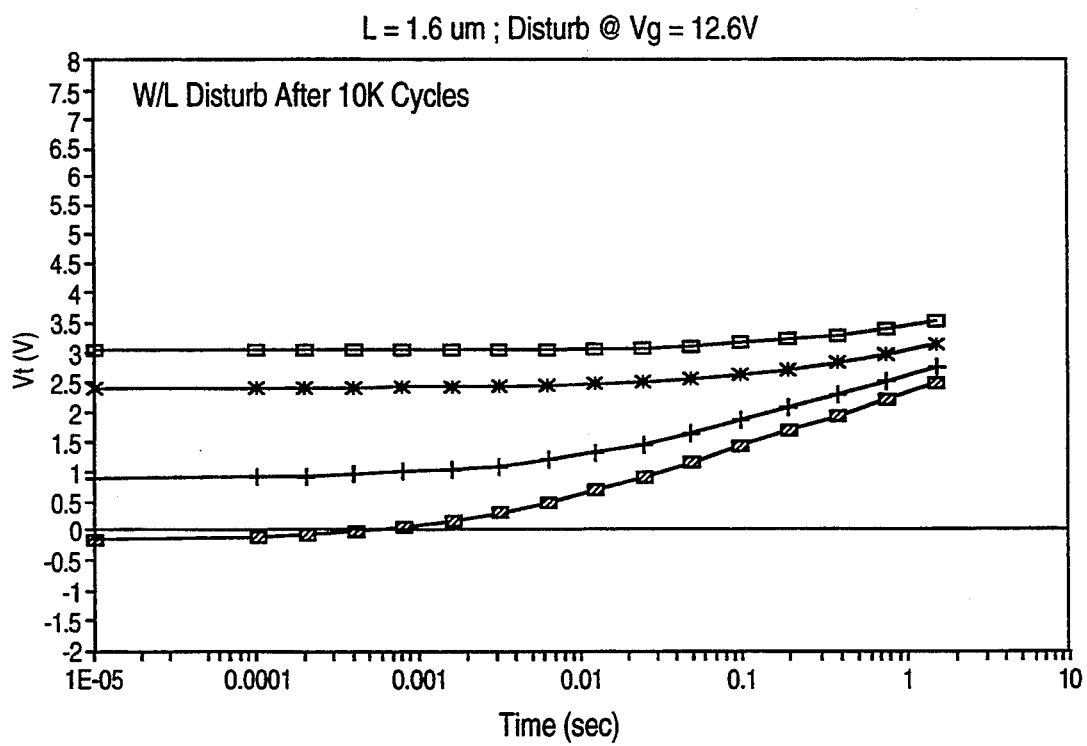
Figure 2D:
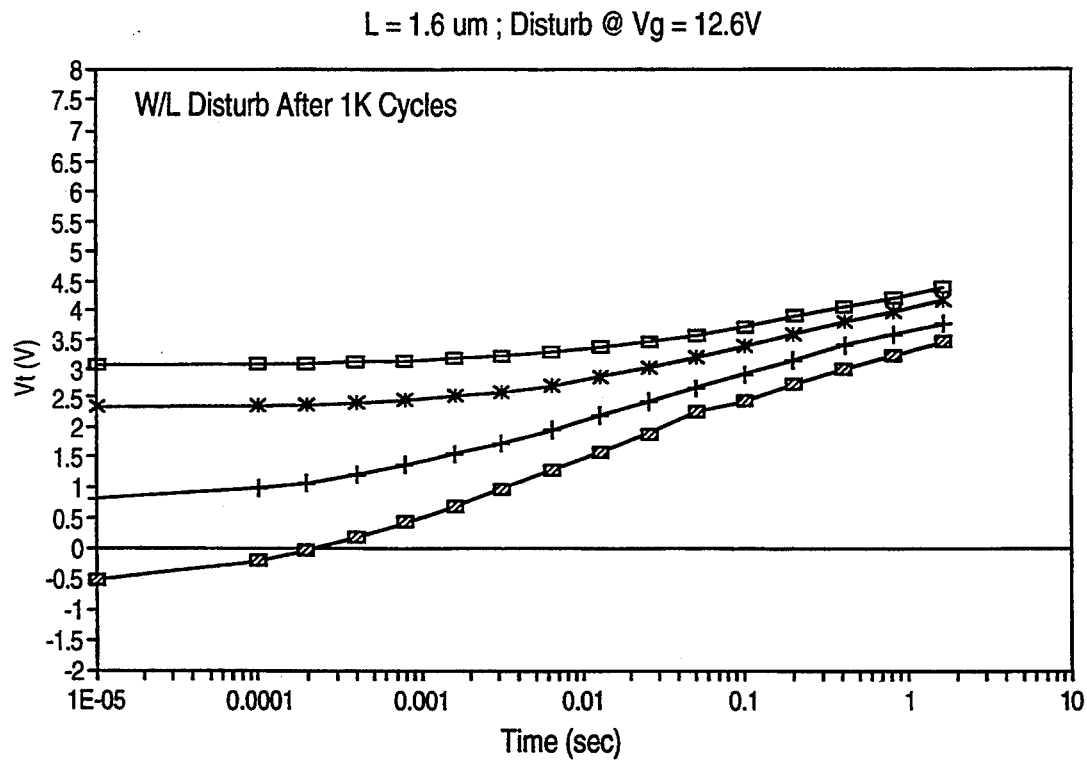

FIGS. 2C and 2D show experimental plots of threshold voltage $V_t$ versus time for memory cells that have been program-erase cycled 10,000 and 1,000 times respectively. As can be seen, word line stress increases the threshold voltages and narrows the distribution of threshold voltages even after 10,000 cycles.

Figure 3:
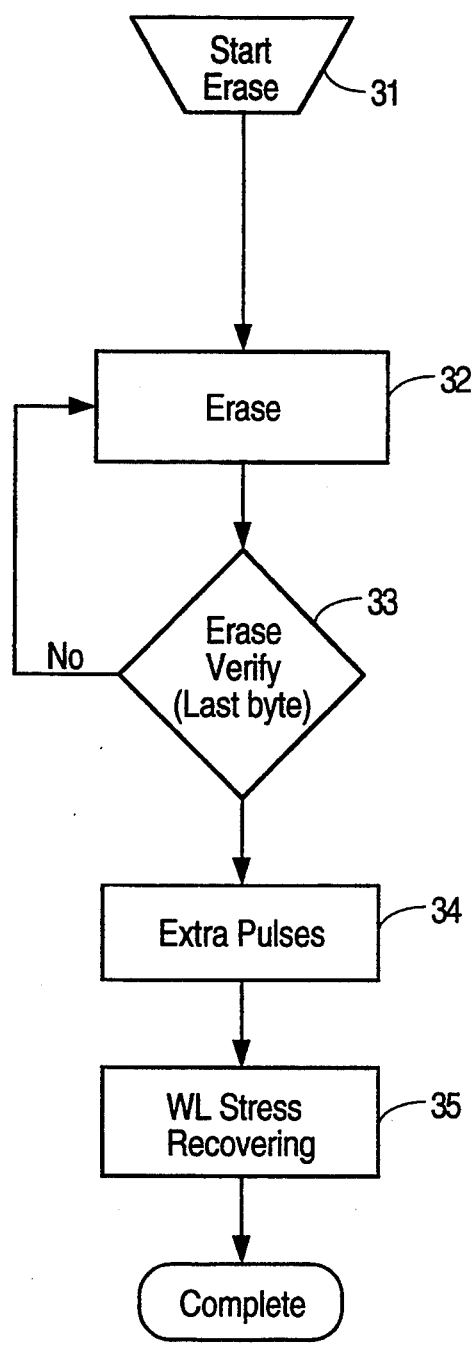
FIG. 3 shows a flow diagram for a method according to an embodiment of the present invention for erasing an array of stacked gate memory cells.

FIG. 3 shows a flow diagram of a method according to an embodiment of the present invention for erasing an array of memory cells. The erase method of FIG. 3 is initiated by a start command 31 which is generated at times depending on the application of the memory cells. For example, when a flash EEPROM containing an array of memory cells is employed to provide data storage for a microprocessor, the microprocessor executing software determines when the flash EEPROM should be erased and generates appropriate signals on I/O pins of the flash EEPROM to start the erase. The erase can then be controlled by control circuitry embedded in the flash EEPROM or by the microprocessor or by other external circuitry executing an erase routine.

The first step of the erase method is a conventional erase 32 of memory cells. Any known or yet to be developed method of erasing memory cells can be employed. Erase methods typically involve applying voltages to memory cell terminals (the control gate, the source, the drain, and the substrate containing the memory cell) to change the threshold voltages of the cells. Many cells and typically all memory cells in a flash EEPROM are simultaneously erased.

One known erase method for an n-channel stacked gate memory cell requires holding the control gate at 0 volts, holding the source at about 11 volts, and allowing the drain to float, for tens or hundreds of milliseconds to lower the threshold voltage to about 2 to 3 volts. A second erase method, negative gate source erase, has the control gate at about $-10$ volts and the source at a power supply voltage Vcc while the drain floats. The third example erase method, negative gate channel erase, has the control gate at about $-10$ volts, the substrate at Vcc while both the source and the drain float or while both the source and the drain are at Vcc. All of these erase methods rely of F-N tunneling through the tunnel oxide to change the threshold voltage.

After erase 32 is an erase verify 33. Erase verify 33 measures if erase 32 successfully lowered all the threshold voltages. One erase verify method is reading every memory cell. If the erase has succeeded in lowering the threshold voltages of all of the memory cells, each cell should turn on when a 5 volts is applied to its control gate. If any of the cells are not erased, erase 32 and erase verify 33 steps are repeated until all of the cells are erased.

Verification schemes generally do not determine if any of the memory cells are over-erased. After the erase verify step 33, the majority of the cells have threshold voltage only slightly below the maximum erased threshold voltage (the erase verify level), typically 3 volts. A few memory cells may erase faster than the majority and become over-erased, having threshold voltages below 1 volt or even below 0 volts. The threshold voltage of the over-erased cells must be raised to ensure proper operation of the array.

Typically, the time of an erase is controlled by a timer, so that the duration of the erase is a number of timer pulses. After erase verify 33 has succeeded, extra erase pulses 34 are applied to the memory cells to further reduce the threshold voltages. The extra erase pulses 34 can be performed in the same manner as the erase step 32. The extra erase pulses 34 create a margin between the highest cell threshold voltages and the erase verify level. The number of pulses can be changed as desired to change the size of the margin. The desired size of the margin depends on a word line stress recovery 35 described below.

After the extra erase pulses 34, word line stress recovery 35 is applied to narrow the distribution of threshold voltages. For n-channel stacked gate memory cells, word line stress can be applied to a memory cell by holding the source and drain at the same voltage (typically ground) and applying a higher voltage to the control gate. As shown in FIGS. 2A-2D, for typical n-channel memory cells, a control gate voltage of 12.6 or 11.8 volts causes a significant narrowing of the threshold voltage distribution in 10 msec. Because the word line stress and most erase methods change the threshold voltage by F-N tunneling, the cells which erase fastest and as a result have lowest threshold voltage also recover fastest during word line stress.

In a particular application, the necessary voltage and duration of word line stress 34 depends on the construction of the memory cells, the history of the memory cells, and the desired width of threshold voltage distribution. The necessary voltage and duration can be experimentally determined for any particular design of stacked gate memory cell and desired threshold voltage distribution. A systematic change in amount of word line stress, either a change of gate voltage or of stress duration, can be employed to compensate for changes in cell response due to use, trapped charges.

As also shown FIGS. 2A-2B, word line stress can increase the threshold voltage of a memory cell over the erase verify level. The margin provided by extra erase pulses 34 ensures that the word line stress does not immediately increase the threshold voltages of some of the memory cells above the erase verify level. The size of the margin and the number of extra erase pulses 34 required depend on the effect of word line stress 35. The margin must be larger than the characteristic increase in threshold voltage, caused by word line stress 35, for a memory cell having initial threshold voltage near the erase verify level. For the cells of FIG. 2A, 2B, 2C, and 2D, a margin of 0.5 volts should be sufficient because the increase from an initial threshold voltage 3 volts, the erase verify level for a 12.6 volt word line stress applied for 10 msec is less that 0.5 volts.

After the word line stress, the erase method is complete. All of the memory cells are erased, and the distribution of threshold voltages is narrower because of the word line stress. The narrower distribution extends the life of a flash EEPROM by recovering individual memory cells which were over-erased or erratic-erased. An acceptable threshold distribution is maintained after more erase-program cycles than would have been possible with prior art erase methods.

Figure 4:
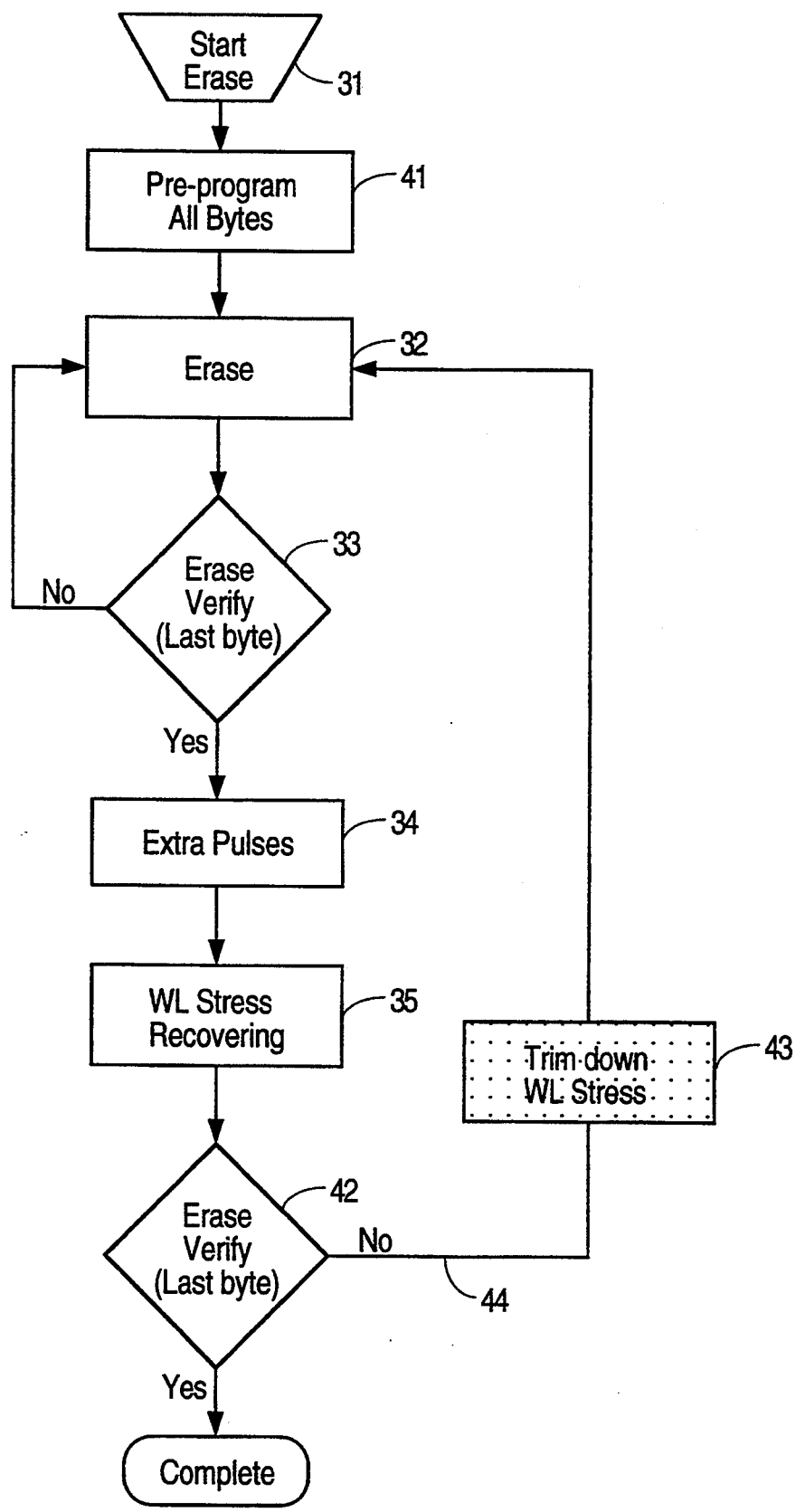
FIG. 4 shows a flow diagram for a method according to a second embodiment of the present invention for erasing an array of stacked gate memory cells.

FIG. 4 shows a flow diagram of a second method according to the present invention for erasing an array of stacked gate memory cells. Steps that can be performed in the manner disclosed in the description of FIG. 3 are given the same reference numbers as in FIG. 3.

After erase start 31, all of the bytes in the array are pre-programmed 41. Memory cells can be programmed individually to raise all threshold voltage to the programmed state. Alternatively, several memory cells can be simultaneously programmed. Several n-channel memory cells, typically eight or sixteen bits, can be simultaneously programmed by holding the sources of the memory cells at 0 volts, the drains (one or more attached bit lines) at about 6.5 volts, and the control gates (one or more attached word line) at about 12.6 volts for approximately 10 $\mu$s. Since programming method described draws current, the number of memory cells that can be simultaneously programmed is limited by the ability of the circuit to carry current. The time required to program millions of cells can be significant. Other programming methods may also be employed.

Before pre-programming 41, some of the cells are erased (have threshold voltage mostly between about 2 and 3 volts) while other cells are programmed (have threshold voltages between about 6 and 8 volts). Pre-programming 41 increases the threshold voltages of all of the erased memory cells. Because typical cells are saturated after one 10 $\mu$s programming pulse, pre-programming 41 does not significantly increase the threshold voltage of already programmed cells. The memory cells therefore have a narrower initial threshold voltage distribution before the erase 32. The narrower initial distribution theoretically provides a narrower distribution after erase 32.

Following pre-programming 41, erase 32 and erase verify 33 can be performed as disclose in regard to FIG. 3. Once the erase is verified, extra pulses 34 are performed also as described in regard to FIG. 3.

Applying a positive voltage on the control gates of n-channel memory cells creates word line stress 35 which increases threshold voltages and narrows threshold voltage distribution. Larger applied voltage during word line stress 35 cause faster increases in threshold voltage. Lower applied voltages provide slower increases. In the method illustrated in FIG. 4, the initial application of word line stress 35 applies a relatively high voltage such a 12.6 volts for 10 msec. An erase verify 42 determines if all of the memory cells remain erased after word line stress 35. Erase verify 42 can be performed in the same manner as the erase verify 33. If all of the memory cells are still erased then the erase is complete.

If some of the memory cells are not erased after word line stress 35, the word line stress must have increased the threshold voltage of some cells above the erase verify level and a recovery loop 44 is performed. The first step in recovery loop 44 is a trim down of word line stress 43 which typically reduces the word line stress voltage. For example, if the applied word line stress voltage was 12.6 volts during the first application of word line stress 35, trim down 43 of word line stress voltage reduces the voltage to be applied in a next application of word line stress by 0.5 volts to 12.1 volts. The trim down of word line stress voltage 43 can reduce the voltage by a fixed amount each time or can reduce voltage in any desired pattern.

After the trim down 43, the array is erased 32, the erase is verified 33, extra erase pulses 34 are applied, and word line stress 35 is again performed. The second application of word line stress 35 applies the trimmed down voltage, 12.1 volts. The lower word line stress voltage decreases the chance that some of the cell will be over stressed and changed to the unerased state by word line stress 35. Erase verify 42 determines if the cells are all erased after the second application of word line stress. If memory cells are not all erased, the trim down and erase loop is repeated until all of the memory cells are erased after an application of word line stress 35. Each time through the loop the magnitude of the applied voltage is decreased, for example, from 12.6 volts to 12.1 volts to 11.6 volts to 11.1 volts, and so on.

As an alternative to reducing the word line stress voltage, the duration of the word line stress may be decreased during trim down 43 to provide a smaller increase in the threshold voltages in the following word line stress.

The advantage of the erase method of FIG. 4 over the method of FIG. 3 is that the method of FIG. 4 provides a more robust and more error resistant erase. The cells are checked to determine if word line stress 35 raised any of the threshold voltages above the erase verify level rather than relying on a predetermined margin. Recovery loop 44 compensates for changes in memory cell response to word line stress that occurs during the life of the memory array.

Although the present invention has been described with reference to particular embodiments, the description is only an example of the invention's application and should not be taken as a limitation. In particular, even though much of preceding discussion was restricted to n-channel stacked gate memory cells the present invention is so not limited. Applications of the present invention to p-channel devices and other stored charge or trapped charge memory cells will be apparent to those of ordinary skill in the art in view of this disclosure. Further, while pre-programming 41 of FIG. 4 can take minutes for a large memory array, the added time for word line stress 42 and recovery loop 44 time is on the order of tens or hundreds of milliseconds. Accordingly, pre-programming 41 may be omitted to provide a faster erase and recovery. Other variations of the disclosed embodiments will be apparent to those skilled in the art.

We claim:

1. A method for erasing an array of memory cells, comprising the steps of:
   (a) applying erase voltages to terminals of a plurality of memory cells, wherein the erase voltages change threshold voltages of memory cells in a direction from a programmed state toward an erased state, the application of erase voltages being sufficient to place all the memory cells in the erased state and provide a margin between the threshold voltage of each cell and an erase verify level that indicates the erased state; and
   (b) applying word line stress voltages to the terminals of the plurality of memory cells, wherein the application of word line stress voltages changes the threshold voltage of over-erased memory cells in a direction from the erased state toward the programmed state and narrows a distribution of the threshold voltages of the memory cells.

2. The method of claim 1, wherein step (a) further comprises:
   (a1) applying first erase voltages to the terminals of the plurality of memory cells, wherein the first erase voltages change threshold voltages of the memory cells in a direction from the programmed state toward the erased state;
   (a2) verifying that every one of the memory cells has a threshold voltage which indicates the memory cell is in the erased state;
   (a3) repeating steps (a1)–(a2) if any of the memory cells are not in the erased state; and
   (a4) applying second erase voltages to the terminals of the plurality of memory cells to further change the threshold voltages of the memory cells in the direction from the programmed state toward the erased state and provide a margin between the threshold voltage of each cell and an erase verify level that indicates the erased state.

3. The method of claim 2, further comprising the steps of:
   (c) verifying after step (b) that every one of the memory cells still has a threshold voltage which indicates the erased state; and
   (d) if the threshold voltage of any of the memory cells does not indicate the erased state, repeating steps (a)–(c) but with magnitudes of word line stress voltages applied during the repeat of step (b) changed to cause a smaller change in the threshold voltages in the direction from the erased state toward the programmed state.

4. The method of claim 2, further comprising the steps of:
   (c) verifying after step (b) that every one of the memory cells still has a threshold voltage which indicates the erased state; and
   (d) if the threshold voltage of any of the memory cells does not indicate the erased state, repeating steps (a)–(c) but with the word line stress voltages applied during the repeat of step (b) applied for a shorter duration to cause a smaller change in the threshold voltages in the direction from the erased state toward the programmed state.

5. The method of claim 1, further comprising the steps of:
   (c) verifying after step (b) that every one of the memory cells still has a threshold voltage which indicates the erased state; and
   (d) if the threshold voltage of any of the memory cells does not indicate the erased state, repeating steps (a)–(c) but with magnitudes of word line stress voltages applied during the repeat of step (b) changed to cause a smaller change in the threshold voltages in the direction from the erased state toward the programmed state.

6. The method of claim 1, further comprising the steps of:

(c) verifying after step (b) that every one of the memory cells still has a threshold voltage which indicates the erased state; and (d) if the threshold voltage of any of the memory cells does not indicate the erased state, repeating steps (a)–(c) but with the word line stress voltages applied during the repeat of step (b) applied for a shorter duration to cause a smaller change in the threshold voltages in the direction from the erased state toward the programmed state.

7. The method of claim 1, wherein the step of applying word line stress voltages comprises:
determining from the past use of the array a magnitude and duration of word line stress needed to confine the distribution of threshold voltages within predefined accepted limits; and
applying the determined magnitude and duration of word line stress.

8. The method of claim 1, wherein the step of applying erase voltages comprises:
applying a first voltage to control gates of the memory cells;
applying a second voltage to a substrate in which sources and drains of the memory cells are formed; and
allowing the sources and the drains of the memory cells to float.

9. The method of claim 1, wherein the step of applying erase voltages comprises:
applying a first voltage to control gates of the memory cells;
applying a second voltage to source terminals of the memory cells; and
allowing drains of the memory cells to float.

10. The method of claim 9, wherein the step of applying word line stress voltages comprises:
applying a third voltage to the control gates; and
applying a fourth voltage to both the source and the drain terminals of the memory cells, wherein the third and fourth voltage tend to change the threshold voltage of the memory cells in the direction from the erased state to the programmed state.

11. The method of claim 10, further comprising the initial step of programming all of the memory cells to have a high threshold voltage.

12. The method of claim 1, further comprising the initial step of programming all of the memory cells.

13. The method of claim 2, further comprising the initial step of programming all of the memory cells.

14. The method of claim 5, further comprising the initial step of programming all of the memory cells.

15. The method of claim 6, further comprising the initial step of programming all of the memory cells.

16. A method for erasing an array of memory cells, comprising the steps of:
(a) applying erase voltages to terminals of a plurality of memory cells, wherein the erase voltages cause Fowler-Nordheim tunneling which changes threshold voltages of memory cells in a direction from a programmed state toward an erased state, the application of erase voltages being sufficient to place all the memory cells in the erased state and provide a margin between the threshold voltage of each cell and an erase verify level that indicates the erased state; and
(b) applying recovery voltages to the terminals of the plurality of memory cells, wherein the recovery voltages cause Fowler-Nordheim tunneling which changes the threshold voltage of over-erased memory cells in a direction from the erased state toward the programmed state and which narrows a distribution of the threshold voltages of the memory cells.

17. The method of claim 16, wherein step (a) further comprises:
(a1) applying first erase voltages to the terminals of the plurality of memory cells, wherein the first erase voltages cause Fowler-Nordheim tunneling which changes threshold voltages of the memory cells in a direction from the programmed state toward the erased state;
(a2) verifying that every one of the memory cells has a threshold voltage which indicates the memory cell is in the erased state;
(a3) repeating steps (a1)–(a2) if any of the memory cells are not in the erased state; and
(a4) applying second erase voltages to the terminals of the plurality of memory cells to further change the threshold voltages of the memory cells in the direction from the programmed state toward the erased state.

18. The method of claim 16, further comprising the steps of:
(c) verifying after step (b) that every one of the memory cells still has a threshold voltage which indicates the erased state; and
(d) if the threshold voltage of any of the memory cells does not indicate the erased state, repeating steps (a)–(c) but with magnitudes of the recovery voltages applied during the repeat of step (b) changed to cause a smaller change in the threshold voltages in the direction from the erased state toward the programmed state.

19. The method of claim 16, further comprising the steps of:
(c) verifying after step (b) that every one of the memory cells still has a threshold voltage which indicates the erased state; and
(d) if the threshold voltage of any of the memory cells does not indicate the erased state, repeating steps (a)–(c) but with the recovery voltages applied during the repeat of step (b) applied for a shorter duration to cause a smaller change in the threshold voltages in the direction from the erased state toward the programmed state.

20. A electrically erasable programmable read only memory comprising:
an array of memory cells arranged in rows and columns, each memory cell having terminals including a control gate, a source, and a drain; and
an embedded erase controller comprising:
erasing means for applying erase voltages to the terminals of the memory cells, wherein the erase voltages tend to change the threshold voltage of the memory cells in a direction from a programmed state to an erased state; and
stressing means for applying word line stress voltages to the terminals of the memory cells to narrow a distribution of the threshold voltages of the memory cells.

21. The electrically erasable programmable read only memory of claim 20, wherein the embedded erase controller further comprises:
verifying means for verifying that all of the memory cells in the array are in the erased state; and means operably attached to the verifying means and the erasing means, for activating the erasing means in response to the verifying means indicating that not all of the memory cells are in the erased state after operation of the erasing means.

22. The electrically erasable programmable read only memory of claim 21, wherein the embedded erase controller further comprises means operably attached to the verifying means and the erasing means, for activating the erasing means in response to the verifying means indicating that not all of the memory cells are in the erased state after operation of the stressing means.

23. The electrically erasable programmable read only memory of claim 20, wherein the embedded erase controller further comprises:

verifying means for verifying that all of the memory cells in the array are in the erased state; and means operably attached to the verifying means and the erasing means, for activating the erasing means in response to the verifying means indicating that not all of the memory cells are in the erased state after operation of the stressing means.

* * * * *